(12) United States Patent
Hosono et al.

(10) Patent No.: US 7,635,440 B2
(45) Date of Patent: Dec. 22, 2009

(54) SPUTTERING TARGET, THIN FILM FOR OPTICAL INFORMATION RECORDING MEDIUM AND PROCESS FOR PRODUCING THE SAME

(75) Inventors: Hideo Hosono, Kanagawa (JP); Kazushige Ueda, Kanagawa (JP); Masataka Yahagi, Ibaraki (JP); Hideo Takami, Ibaraki (JP)

(73) Assignee: Nippon Mining & Metals Co., Ltd., Tokyo (JP)

( * ) Notice: Subject to any disclaimer, the term of this patent is extended or adjusted under 35 U.S.C. 154(b) by 485 days.

(21) Appl. No.: 10/547,815

(22) PCT Filed: Feb. 3, 2004

(86) PCT No.: PCT/JP2004/001051

§ 371 (c)(1),
(2), (4) Date: Sep. 2, 2005

(87) PCT Pub. No.: WO2004/079038

PCT Pub. Date: Sep. 16, 2004

(65) Prior Publication Data

US 2006/0147740 A1   Jul. 6, 2006

(30) Foreign Application Priority Data

Mar. 4, 2003 (JP) .............................. 2003-056884

(51) Int. Cl.
*H01B 1/08* (2006.01)
(52) U.S. Cl. .............................. 252/519.51; 252/519.5; 252/518.1; 252/519.1
(58) Field of Classification Search ............ 252/519.51, 252/519.5, 518.1, 519.1
See application file for complete search history.

(56) References Cited

U.S. PATENT DOCUMENTS

| | | | |
|---|---|---|---|
| 5,843,341 A * | 12/1998 | Orita et al. ............... | 252/519.1 |
| 5,972,527 A | 10/1999 | Kaijou et al. ............... | 428/697 |
| 6,042,752 A * | 3/2000 | Mitsui ..................... | 252/520.1 |
| 6,528,442 B1 * | 3/2003 | Kuwano et al. ............... | 501/41 |
| 6,998,070 B2 * | 2/2006 | Inoue et al. ............ | 252/519.51 |
| 7,061,014 B2 * | 6/2006 | Hosono et al. ................ | 257/43 |
| 7,279,211 B2 * | 10/2007 | Yahagi et al. .............. | 428/64.1 |
| 7,306,861 B2 * | 12/2007 | Inoue et al. .................. | 428/702 |
| 7,393,600 B2 * | 7/2008 | Inoue et al. .................. | 428/697 |
| 2001/0040733 A1 | 11/2001 | Toyoshima et al. ......... | 359/585 |
| 2005/0084799 A1 | 4/2005 | Yahagi et al. .......... | 430/270.11 |
| 2005/0115829 A1 | 6/2005 | Yahagi et al. .......... | 204/298.13 |

FOREIGN PATENT DOCUMENTS

| | | | |
|---|---|---|---|
| JP | 11-158607 | | 6/1999 |
| JP | 11-256321 | | 9/1999 |
| JP | 2000044236 A | * | 2/2000 |
| JP | 2000-195101 | | 7/2000 |
| JP | 2000-256061 | | 9/2000 |
| JP | 2002-226267 | | 8/2002 |

OTHER PUBLICATIONS

Minami et al., "New Transparent Conducting $ZnO$-$In_2O_3$-$SnO_2$ Thin Films Prepared by Magnetron Sputtering", Thin Solid Films, vol. 317, pp. 318-321, 1998, month unknown.

Esp@cenet, One Page English Abstract of JP 2000-026119, Jan. 2000.

Esp@cenet, One Page English Abstract of JP 2000-044236, Feb. 2000.

* cited by examiner

*Primary Examiner*—Douglas McGinty
(74) *Attorney, Agent, or Firm*—Howson & Howson LLP

(57) ABSTRACT

Provided is a sputtering target having a relative density of 80% or more and containing a compound having as its principal component zinc oxide satisfying $A_xB_yO_{(KaX+KbY)/2}(ZnO)_m$, $1<m$, $X \leqq m$, $0<Y \leqq 0.9$, $X+Y=2$, where A and B are respectively different positive elements of trivalence or more, and the valencies thereof are respectively Ka and Kb. Obtained is a ZnO based sputtering target which does not contain ZnS and $SiO_2$, and, upon forming a film via sputtering, is capable of reducing the affect of heating the substrate, of performing high speed deposition, of adjusting the film thickness to be thin, of reducing the generation of particles (dust) and nodules during sputtering, of improving the productivity with small variation in quality, and which has fine crystal grains and a high density of 80% or more, particularly 90% or more.

20 Claims, No Drawings

SPUTTERING TARGET, THIN FILM FOR OPTICAL INFORMATION RECORDING MEDIUM AND PROCESS FOR PRODUCING THE SAME

BACKGROUND OF THE INVENTION

The present invention relates to a sputtering target which allows direct current (DC) sputtering upon forming a film via sputtering, has minimal arcing during sputtering, is capable of reducing particles (dust) and nodules resulting therefrom, has high density and small variation in quality, and is capable of improving the productivity, as well as to the manufacturing method thereof. The present invention also relates to a thin film for an optical information recording medium (particularly used as a protective film) obtained by using the said target as well as to the manufacturing method thereof.

In recent years, technology of high density optical recording disks such as high density optical information recording mediums capable of rewriting without requiring a magnetic head has been developed, and these disks are rapidly attracting attention. This optical disc can be classified into the three categories of ROM (read-only), R (write-once) and RW (re-writable). Particularly, the phase change method employed in the RW type discs is attracting attention. The recording principle employing this phase change optical disk is briefly explained below.

This phase change optical disc performs the recording/reproduction of information by heating and increasing the temperature of a recording thin film on a substrate by irradiating a laser beam thereto, and generating a crystallographic phase change (amorphous⇌crystal) in the structure of such recording thin film. More specifically, the reproduction of information is conducted by detecting the change in the reflectivity caused by the change in the optical constant of the phase.

The aforementioned phase change is performed with the irradiation of a laser beam narrowed down to a diameter of approximately several hundred nm to several µm. Here, for example, when a 1 µm laser beam passes through at a linear velocity of 10 m/s, light is irradiated to a certain point on the optical disc for 100 ns, and it is necessary to perform the aforementioned phase change and detect the reflectivity within such time frame.

Moreover, in order to realize the foregoing crystallographic phase change; that is, the phase change of the amorphous and crystal, not only will the recording layer be subject to repeated heating and rapid cooling, the peripheral dielectric protective layer and the reflective film of aluminum alloy will also be repeatedly subject thereto.

In light of the above, a phase change optical disc has a four-layer structure wherein, for instance, both sides of a Ge—Sb—Te recording thin film layer or the like are sandwiched with a ZnS—$SiO_2$ high-melting point dielectric or the like, and an aluminum alloy reflective layer is additionally provided thereto.

Among the above, in addition to being demanded of an optical function capable of increasing the absorption of a laser beam at the amorphous portion and crystal portion of the recording layer, and which has a large reflectivity difference, the reflective layer and protective layer are also demanded of a function for preventing the deformation caused by the moisture resistance or heat of the recording thin film as well as a function for controlling the thermal conditions upon recording (c.f. "*Kogaku*" magazine, volume 26, no. 1, pages 9 to 15).

As described above, the protective layer of a high-melting point dielectric must be durable against repeated thermal stress caused by the heating and cooling, must not allow such thermal effect to influence the reflective film or other areas, and it is also required to be thin, of low reflectivity, and possess strength to prevent deterioration. From this perspective, the dielectric protective layer plays an important role.

The dielectric protective layer described above is usually formed with the sputtering method. This sputtering method makes a positive electrode substrate and a negative electrode target face each other, and generates an electric field by applying a high voltage between the substrates thereof and the targets under an inert gas atmosphere. The sputtering method employs a fundamental principle where the inert gas are ionized, plasma which consists of electrons and the positive ion is formed, the positive ion in this plasma extrudes the atoms structuring the target by colliding with the target (negative electrode) surface, and the extruded atoms adhere to the opposing substrate surface, wherein the film is formed thereby.

Conventionally, ZnS—$SiO_2$ has been widely used as the protective layer of a rewritable optical recording medium due to its superior characteristics regarding optical characteristics, heat characteristics, and adhesiveness with the recording layer. Nevertheless, a rewritable DVD is demanded of increased number of rewritings in addition to the realization of shorter wavelengths of the laser wavelength, realization of a large capacity and high speed recording are also strongly demanded, and the characteristics of conventional ZnS—$SiO_2$ are becoming insufficient.

As one reason that the number of times the optical information recording medium can be rewritten will deteriorate, there is a problem in that the sulfur constituent from the ZnS—$SiO_2$ will be diffused to the recording layer material disposed between ZnS—$SiO_2$. Also, pure Ag or Ag alloy having high reflectivity and high thermal conductance characteristics for realizing large capacity and high speed recording is being used as the reflective layer material.

This reflective layer is also disposed adjacent to the ZnS—$SiO_2$ protective layer material, and, due to the diffusion of the sulfur constituent from ZnS—$SiO_2$, the pure Ag or Ag alloy reflective layer material would become corroded and deteriorate, and caused the deterioration in the characteristics of the reflectivity and so on of the optical information recording medium.

Although an intermediate layer having nitride or carbide as its principal component is provided between the reflective layer and protective layer, and between the recording layer and protective layer in order to prevent the diffusion of the sulfur constituent, there are problems in that the throughput will deteriorate and costs will increase as a result of the increased number of layers.

In order to overcome these problems, a material having similar characteristics as with the ZnS—$SiO_2$ protective layer material that does not contain ZnS is being sought. Further, since $SiO_2$ often causes the deterioration in the deposition rate and abnormal electrical discharge, it is desirable to avoid adding the same.

In light of the above, the use of a material having as its principal component a ZnO base homologous compound (c.f. technical journal "Solid Physics" C. Li et al., Vol. 35, No. 1, 2000, page 23 to 32 "Microscopic Observation of Modulated Structure of Homologous Compound $RMO_3(ZnO)_m$ (R=In, Fe; M=In, Fe, Ga, Al; m=natural number)") that does not contain ZnS and $SiO_2$ has been considered.

Since a ZnO base homologous compound has a complex layer structure, it is characterized in that it is capable of stably retaining the amorphous nature during deposition, and in this respect, this compound yields the same effect as the addition of $SiO_2$. Further, this is transparent in the used wavelength range, and the refractive index is also similar to $ZnS$—$SiO_2$.

As described above, by reducing or eliminating the influence of the sulfur constituent by using a material having oxide as its principal component as a substitute for a $ZnS$—$SiO_2$ protective layer material, this has been expected to improve the characteristics of the optical information recording medium, and improve the productivity thereof.

Generally speaking, as examples of using a material having a homologous compound as its principal component as a transparent conductive material, for instance, there is a method of forming a zinc-indium oxide target via laser abrasion (c.f. Japanese Patent Laid-Open Publication No. 2000-26119), an example of a transparent conductive film containing amorphous nature oxide and having favorable conductivity and in particular favorable blue light permeability (c.f. Japanese Patent Laid-Open Publication 2000-44236), and an example of a moisture resistance film forming target having In and Zn as its principal components, which is $In_2O_3$ $(ZnO_2)m$(m=2 to 20), and the atomic ratio of In and Zn(In/(In+Zn)) is 0.2 to 0.85 (c.f. Japanese Patent No. 2695605).

Nevertheless, it could not be said that the material forming the foregoing transparent conductive film was sufficient as a thin film for an optical information recording medium (in particular for use as a protective film). Meanwhile, with the ZnO based homologous compound, there is a problem in that it is difficult to increase the bulk density, and only a low density sintered body target can be obtained.

With this kind of low density target, there are problems in that arcing easily occurs during the formation of the film via sputtering, particles (dust) and nodules will generate during sputtering as a result of such arcing, and, not only will the uniformity and quality of deposition deteriorate, the productivity will also deteriorate.

SUMMARY OF THE INVENTION

The present invention relates to a ZnO based sputtering target that does not contain ZnS and $SiO_2$, and, an object of the present invention is to provide a sputtering target which upon forming a film via sputtering, is capable of reducing the affect of heating the substrate, performing high speed deposition, adjusting the film thickness to be thin, reducing the generation of particles (dust) and nodules during sputtering, improving the productivity with small variation in quality, and which has fine crystal grains and a high density of 80% or more, particularly 90% or more. In particular, the object of the present invention is to obtain a thin film for an optical information recording medium optimal for use as a protective film, as well as the manufacturing method thereof.

In order to achieve the foregoing objects, as a result of intense study, the present inventors discovered that by adjusting the component of a compound having zinc oxide as its principal component and increasing the density thereof, characteristics as the protective film can be maintained, the generation of particles and nodules upon sputtering can be reduced, and the uniformity of the film thickness can also be improved.

Based on the forgoing discovery, the present invention provides:

1. A sputtering target containing a compound having as its principal component zinc oxide satisfying $A_xB_yO_{(KaX+KbY)/2}(ZnO)_m$, 1<m, X≦m, 0<Y≦0.9, X+Y=2, where A and B are respectively different positive elements of trivalence or more, and the valencies thereof are respectively Ka and Kb, wherein A is indium, the relative density is 90% or more, the range of variation of positive elements other than zinc in the target is within 0.5%, and the range of variation of density in the target is within 3%.

The present invention further provides:

2. A thin film for an optical information recording medium formed by using the sputtering target according to paragraph 1 above;
3. The thin film for an optical information recording medium according to paragraph 2 above, which is used adjacent to a reflective layer or a recording layer; and
4. A manufacturing method of a thin film for an optical information recording medium, wherein the sputtering target according to paragraph 1 above is used to form a thin film via direct current sputtering.

DETAILED DESCRIPTION OF THE INVENTION

The sputtering target of the present invention contains a compound having as its principal component zinc oxide satisfying $A_xB_yO_{(KaX+KbY)/2}(ZnO)_m$, 1<m, X≦m, 0<Y≦0.9, X+Y=2, when A and B are respectively different positive elements of trivalence or more, and the valencies thereof are respectively Ka and Kb, and having a relative density is 80% or more, even a relative density of 90% or more. Further, the range of these compositions further stabilizes the amorphous nature of the film.

The high density target of the present invention having zinc oxide as its principal component is superior in preventing abnormal electrical discharge, as well as improving and stabilizing the deposition rate.

As the positive elements A and B described above, at least one or more elements selected from aluminum, gallium, indium, scandium, yttrium, lanthanum, vanadium, chrome, manganese, iron, niobium, tantalum, germanium, tin, antimony and so on may be used.

In particular, indium is preferably used as A. Moreover, the compound of the present invention having zinc oxide as its principal component may also contain another homologous compound such as InGa(MgO) or the like.

With the sputtering target of the present invention, the range of variance of positive elements other than zinc in the target can be suppressed to be within 0.5%, and even within 0.3%, and the range of variance of density in the target can be suppressed to be within 3%, and even within 1.5%.

As a result, a thin film for an optical information recording medium (protective film) having superior film thickness and uniformity characteristics can be formed. This protective film may be used adjacent to the reflective layer or recording layer.

The high density sputtering target obtained according to the present invention may be used to form a thin film via the radio frequency (RF) sputtering method or direct current (DC) sputtering method. Particularly, in comparison to RF sputtering, DC sputtering is superior in that the deposition speed is fast, and the sputtering efficiency is favorable.

Further, the DC sputtering device has advantages in that it is inexpensive, easy to control, and has low power consumption. Moreover, when the target is combined with an additive having a high refractive index, a reflective index of the materials being used in the present invention can be made larger than ordinary $ZnS$—$SiO_2$ (2.0 to 2.1). Thus, since the film thickness of the protective film itself can also be made thin, productivity improvement and substrate heating prevention effects can also be yielded.

Therefore, by using the sputtering target of the present invention, the productivity will improve, and high quality materials can be obtained. Thus, there is a significant effect in that an optical recording medium with an optical disk protective film can be manufactured inexpensively and stably.

Upon manufacturing the sputtering target of the present invention, normal pressure sintering or high temperature pressure sintering is performed to the oxide powder of the respective constituent elements having an average grain size of 5 μm or less. As a result, a high density target having fine and uniform crystal grains can be manufactured.

In particular, it is desirable to calcinate the material at 800 to 1300° C. before sintering, to pulverize this to 1 μm or less, and to sinter the calcinated powder. Or, after retaining the material at 800° C. to 1300° C. and sufficiently advancing the reaction, this may be sintered at a higher temperature. Also, this may be sintered in an inert atmosphere such as in a vacuum or under an argon or nitrogen atmosphere.

According to the present invention, a high density target having a relative density of 80% or more, and even 90% or more can be obtained. The improved density of the sputtering target of the present invention will reduce pores and miniaturize crystal grains, the sputter face of the target can be made even and smooth. Thus, a significant effect is yielded in that the particles and nodules during sputtering can be reduced, the target life can be prolonged, variation in quality can be reduced, and the productivity can also be improved.

EXAMPLES AND COMPARATIVE EXAMPLES

The present invention is now explained in detail with reference to the Examples and Comparative Examples. Incidentally, these Examples are merely illustrative, and the present invention shall in no way be limited thereby. In other words, the present invention shall only be limited by the scope of claim for a patent, and shall include the various modifications other than the Examples of this invention.

Example 2

$In_2O_3$ powder equivalent to 4N and 5 μm or less, $Al_2O_3$ powder equivalent to 4N and 1 μm or less and ZnO powder equivalent to 4N and having an average crystal grain size of 5 μm or less were prepared, blended to become $In_{1.5}Al_{0.5}O_3(ZnO)_4$, subject to wet blending, dried, and thereafter calcinated at 1100° C. After calcination, this was subject to wet pulverization until the average grain size became equivalent to 1 μm, the dried powder was filled in a mold, subject to cold pressing, thereafter subject to normal pressure sintering at a temperature of 1400° C. to obtain a target. The relative density of this target was 97%.

This target was processed to become a 6 inch φ size target, and then sputtered. The sputtering conditions were RF sputtering, sputtering power of 1000 W, Ar gas pressure of 0.5 Pa, and the target was deposited on a glass substrate with a target film thickness of 1500 Å. The transmittance of the deposited sample was 98% (wavelength 650 nm), and the reflective index was 1.9 (wavelength 633 nm).

Further, the deposited sample was measured by XRD (Cu—K α, 40 kV, 30 mA, hereinafter the same) after the annealing treatment (600° C.×30 mm, Ar flow). The maximum peak intensity ratio against an undeposited glass substrate in 2θ=20 to 60° was 1.2, and a stable amorphous nature was maintained.

The chemical composition, relative density, amorphous nature, transmittance and refractive index of the target of Example 2 are shown in Table 1.

TABLE 1

| Example | Composition | Density (%) | Amorphous Nature | Transmittance | Refractive Index |
|---|---|---|---|---|---|
| Example 2 | $In_{1.5}Al_{0.5}O_3(ZnO)_4$ | 97 | 1.2 | 98% | 1.9 |
| Example 3 | $In_{1.1}Ga_{0.9}O_3(ZnO)_{4.2}$ | 99 | 1.0 | 99% | 1.9 |
| Example 6 | $In_{1.5}Fe_{0.5}O_3(ZnO)_4$ | 93 | 1.6 | 90% | 2.3 |
| Example 7 | $In_{1.1}Ga_{0.4}Al_{0.5}O_3(ZnO)_4$ | 95 | 1.1 | 99% | 1.9 |
| Example 8 | $In_{1.2}Y_{0.3}Al_{0.4}O_3(ZnO)_4$ | 91 | 1.3 | 98% | 1.9 |
| Comparative Example 1 | $In_{1.3}Al_{0.7}O_3(ZnO)_{0.8}$ | 82 | 8.3 | 95% | 1.9 |
| Comparative Example 2 | $In_{0.8}Al_{1.2}O_3(ZnO)_5$ | 93 | 5.1 | 95% | 1.8 |
| Comparative Example 3 | $Fe_{1.0}Al_{1.0}O_3(ZnO)_{0.25}$ | 82 | 12.3 | 50% | 2.7 |
| Comparative Example 4 | $Al_{1.0}Sn_{0.5}O_{2.5}(ZnO)_{0.4}$ | 80 | 9.2 | 87% | 2.3 |

Examples 3, 6, 7 and 8

As shown in Table 1, the component composition was changed within the scope of the present invention, and raw material powder having an average grain size similar to Example 2 was used and similarly subject to calcination, pulverization and normal pressure sintering,this was further processed into a target, and this target was used to perform sputtering.

The target composition, relative density, amorphous nature, transmittance andrefractive index of the foregoing Examples are shown in Table 1. As shown in Table 1, thetargets included in the conditions of the present invention have a relative density of 90%or more, the amorphous nature was favorably maintained, and the transmittance and refractiveindex were also favorable.

Comparative Example 1

$In_2O_3$ powder equivalent to 4N and 5 μm or less, $Al_2O_3$ powder equivalent to 4N and 1 μm or less and ZnO powder equivalent to 4N and having an average grain size of 5 μm or less were prepared, blended to become $In_{1.3}Al_{0.7}O_3(ZnO)_{0.8}$, subject to wet blending, dried, and thereafter calcinated at 1100° C. After calcination, this was subject to wet pulverization until the average grain size became equivalent to 1 μm, the dried powder was filled in a mold, subject to cold pressing, thereafter subject to normal pressure sintering at a temperature of 1400° C. to obtain a target. The relative density of this target was 92%.

This target was processed to become a 6 inch φ size target, and then sputtered. The sputtering conditions were RF sputtering, sputtering power of 1000 W, Ar gas pressure of 0.5 Pa, and the target was deposited on a glass substrate with a target film thickness of 1500 Å. The transmittance of the deposited sample was 95% (wavelength 650 nm), and the refractive index was 1.9 (wavelength 633 nm).

Further, the deposited sample was measured by XRD after the annealing treatment (600° C.×30 min, Ar flow). The maximum peak intensity ratio against an undeposited glass substrate in 2θ=20 to 60° was 8.3, and a stable amorphous nature could not be obtained.

The chemical composition, relative density, amorphous nature, transmittance and refractive index, variation of composition and variation of density of the target of Comparative Example 1 are shown in Table 1.

Comparative Examples 2 to 4

As shown in Table 1, the component composition was changed (ZnO is outside the scope of the present invention), and raw material powder having an average grain size similar to Comparative Example 1 was used and similarly subject to calcination, pulverization and normal pressure sintering, this was further processed into a target, and this target was used to perform sputtering.

The target composition, relative density, amorphous nature, transmittance and refractive index of the foregoing Comparative Examples are shown in Table 1. As shown in Table 1, although the targets outside the conditions of the present invention have a relative density of 80% or more, a specific crystal peak was observed, and a stable amorphous nature could not be obtained. Further, the transmittance in Comparative Example 3 significantly aggravated, and the refractive index also tended to increase.

The present invention, as shown with the foregoing Examples, does not contain ZnS and $SiO_2$, adjusts the component of a compound having ZnO as its principal component to make the density 80% or more, even 90% or more, and further yields a significant effect in that, as a result of reducing the variations in the composition and density, it eliminates factors that cause deterioration or variances in the characteristics of the film, reduces particles (dust) and nodules generated during the sputtering upon deposition, and improves the productivity while minimizing the variation in quality.

Contrarily, in the Comparative Examples, the component of the compound having ZnO as its principal component is outside the scope of the present invention, and the transmittance deteriorated and a stable amorphous nature could not be obtained. Further, there were problems in that an abnormal electrical discharge occurred during sputtering, and particles (dust) and nodules increased as a result thereof, and the characteristics as a phase change optical disk protective film were also lost.

In the foregoing Examples 2, 3, 6, 7 and 8, although indium, aluminum, yttrium, iron, and gallium were used as the positive elements (A, B) of trivalence or more, cases of employing one or more elements selected from tin, scandium, lanthanum, vanadium, chrome, manganese, niobium, tantalum, germanium, antimony and so on which are other positive elements of trivalence or more also showed similar results as with Examples 2, 3, 6, 7 and 8 (these results have been omitted since they were redundant and complex.) Also, the same results were obtained when the foregoing elements were combined.

The present invention manufactures a target that does not contain ZnS and $SiO_2$ and which is formed from a compound having ZnO as its principal component and adjusts the component of such compound so as to make the density of the target 80% or more, preferably 90% or more, and, by reducing the variations in the composition and density, factors causing the deterioration or variations in the film characteristics have been eliminated thereby. Further, as a result of enabling DC sputtering, a significant effect is yielded in that the sputtering controllability, which is characteristic to DC sputtering, can be facilitated, the deposition speed can be increased, and the sputtering efficiency can be improved.

Further, by adjusting the composition of the additive, the refractive index can also be improved. Thus, as a result of using this sputtering target, the productivity will improve, high quality materials can be obtained, and an optical recording medium with an optical disk protective film can be manufactured inexpensively and stably.

Moreover, a high density target is able to reduce the generation of particles (dust) and nodules during sputtering, improve productivity with little variation in quality, maintain the characteristics as a protective film, and a significant effect is yielded in that this target may be used to obtain an optical recording medium having formed thereon a phase change optical disk protective film having zinc oxide as its principal component.

The invention claimed is:

1. A sputtering target having a relative density of 90% or more and containing a compound having as its principal component zinc oxide satisfying $A_xB_yO_{(KaX+KbY)/2}(ZnO)_m$, where $2 \leq m$, $0 < Y \leq 0.9$, $X+Y=2$, and where A and B are respectively different positive elements of trivalence or more and are selected from the group consisting of aluminum, gallium, indium, scandium, yttrium, lanthanum, vanadium, chromium, manganese, iron, niobium, tantalum, germanium, tin and antimony, and the valencies thereof are respectively Ka and Kb, wherein a range of variation of positive elements other than zinc in the target is within 0.5% and a range of variation of density in the target is within 3%.

2. A sputtering target for producing a protective film of a phase change optical information recording medium, comprising:
   a sputtering target made of a compound having zinc oxide as its principal component and being a sintered body of calcinated powder of average grain size of 1 μm of less;
   said sputtering target having a relative density of 90% or more, fine and uniform crystal grains, and an amorphous nature;
   said compound satisfying $A_xB_yO_{(KaX+KbY)/2}(ZnO)_m$, where $4 \leq m$, $0 < Y \leq 0.9$, and $X+Y=2$, and where A and B are respectively different positive elements of trivalence or more, and the valencies thereof are respectively Ka and Kb; and
   said sputtering target having a range of variation of positive elements other than zinc within 0.5% and a range of variation of density within 3%.

3. A sputtering target according to claim 2, wherein A in said compound is indium.

4. A sputtering target according to claim 3, wherein said amorphous nature of said sputtering target is retained during sputtering deposition of a thin film such that said thin film produced from said target has an amorphous nature.

5. A sputtering target according to claim 3, wherein said amorphous nature and composition of said sputtering target is such that, when said sputtering target is sputtered, it forms a thin film having a maximum peak intensity ratio against an undeposited glass substrate in 2θ=20 to 60° measured by XRD of 1.0 to 1.6.

6. A sputtering target according to claim 3, wherein m in said compound equals 4.

7. A sputtering target according to claim 3, wherein said compound is selected from the group consisting of $In_{1.5}Al_{0.5}O_3(ZnO)_4$, $In_{1.1}Ga_{0.9}O_3(ZnO)_{4.2}$, $In_{1.5}Fe_{0.5}O_3(ZnO)_4$, $In_{1.1}Ga_{0.4}Al_{0.5}O_3(ZnO)_4$, and $In_{1.2}Y_{0.3}Al_{0.4}O_3(ZnO)_4$.

8. A sputtering target according to claim 1, wherein said compound is $In_{1.2}Fe_{0.8}O_3(ZnO)_2$.

9. A sputtering target according to claim 2, wherein A and B are selected from the group consisting of aluminum, gallium, indium, scandium, yttrium, lanthanum, vanadium, chromium, manganese, iron, niobium, tantalum, germanium, tin and antimony.

10. A sputtering target according to claim 2, wherein A and B are selected from the group consisting of indium, scandium, yttrium, lanthanum, vanadium, chromium, manganese, iron, niobium, tantalum, germanium, tin and antimony.

11. A sputtering target according to claim 3, wherein B is selected from the group consisting of scandium, yttrium, lanthanum, vanadium, chromium, manganese, iron, niobium, tantalum, germanium, tin and antimony.

12. A sputtering target according to claim 2, wherein A and B are selected from the group consisting of scandium, yttrium, lanthanum, vanadium, chromium, manganese, iron, niobium, tantalum, germanium, tin and antimony.

13. A sputtering target according to claim 2, wherein said sputtering target is a direct current (DC) sputtering target.

14. A sputtering target according to claim 2, wherein said sputtering target is a radio frequency (RF) sputtering target.

15. A sputtering target for producing a protective film of a phase change optical information recording medium, comprising:

a sputtering target made of a compound having zinc oxide as its principal component;

said sputtering target having a relative density of 90% or more, fine and uniform crystal grains, and an amorphous nature;

said compound satisfying $A_xB_yO_{(KaX+KbY)/2}(ZnO)_m$, where $2 \leq m$, $0 < Y \leq 0.8$, and $X+Y=2$, and where A and B are respectively different positive elements of trivalence or more, the valencies thereof are respectively Ka and Kb, and where A is indium (In);

said sputtering target having a range of variation of positive elements other than zinc within 0.5% and a range of variation of density within 3%.

16. A sputtering target according to claim 15, wherein B is selected from the group consisting of scandium, yttrium, lanthanum, vanadium, chromium, manganese, iron, niobium, tantalum, germanium, tin and antimony.

17. A sputtering target according to claim 15, wherein B is selected from the group consisting of aluminum and gallium.

18. A sputtering target according to claim 15, wherein said sputtering target is a sintered body of calcinated powder of average grain size of 1 μm of less.

19. A sputtering target according to claim 1, wherein said sputtering target is a sintered body of calcinated powder of average grain size of 1 μm of less.

20. A sputtering target according to claim 1, wherein Y is less than or equal to 0.8.

* * * * *

UNITED STATES PATENT AND TRADEMARK OFFICE
CERTIFICATE OF CORRECTION

PATENT NO. : 7,635,440 B2  Page 1 of 1
APPLICATION NO. : 10/547815
DATED : December 22, 2009
INVENTOR(S) : Hosono et al.

It is certified that error appears in the above-identified patent and that said Letters Patent is hereby corrected as shown below:

Column 4, line 20 "X÷Y=2" should read "X+Y=2"

Column 6, line 8 "C.×30 mm," should read "C.×30 min"

Column 5 and 6 (TABLE 1) the following sentence should be added after TABLE 1: "Amorphous nature is represented in a maximum peak intensity ratio against an undeposited glass substrate in $2\theta = 20$ to $60°$ measured by XRD."

Column 6, line 48 "90%or more," should read "90% or more"

Column 6, line 49 "refractivein-" should read "refractive in-"

Column 7, line 57 "otherpositive" should read "other positive"

Signed and Sealed this

Sixth Day of April, 2010

David J. Kappos
*Director of the United States Patent and Trademark Office*

UNITED STATES PATENT AND TRADEMARK OFFICE
CERTIFICATE OF CORRECTION

PATENT NO. : 7,635,440 B2
APPLICATION NO. : 10/547815
DATED : December 22, 2009
INVENTOR(S) : Hosono et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 654 days.

Signed and Sealed this

Twenty-first Day of December, 2010

David J. Kappos
*Director of the United States Patent and Trademark Office*